United States Patent
Kang et al.

(10) Patent No.: US 8,214,696 B2
(45) Date of Patent: Jul. 3, 2012

(54) APPARATUS AND METHOD FOR TRANSMITTING SIGNAL USING BIT GROUPING IN WIRELESS COMMUNICATION SYSTEM

(75) Inventors: Seung Hyun Kang, Gyeonggi-do (KR); Suk Woo Lee, Gyeonggi-do (KR)

(73) Assignee: LG Electronics Inc., Seoul (KR)

( * ) Notice: Subject to any disclaimer, the term of this patent is extended or adjusted under 35 U.S.C. 154(b) by 335 days.

(21) Appl. No.: 12/698,856

(22) Filed: Feb. 2, 2010

(65) Prior Publication Data

US 2010/0218075 A1 Aug. 26, 2010

Related U.S. Application Data

(60) Provisional application No. 61/149,317, filed on Feb. 2, 2009, provisional application No. 61/157,196, filed on Mar. 3, 2009.

(30) Foreign Application Priority Data

Jul. 24, 2009 (KR) .................. 10-2009-0067727

(51) Int. Cl.
*H03M 13/27* (2006.01)
*H03M 13/29* (2006.01)
(52) U.S. Cl. .................. 714/701; 714/755
(58) Field of Classification Search .......... 714/701, 714/755
See application file for complete search history.

(56) References Cited

U.S. PATENT DOCUMENTS

| | | | | |
|---|---|---|---|---|
| 6,289,486 B1 * | 9/2001 | Lee et al. | ........................ | 714/788 |
| 6,715,120 B1 * | 3/2004 | Hladik et al. | .................. | 714/755 |
| 6,785,859 B2 * | 8/2004 | Goldman | ....................... | 714/755 |
| 7,089,480 B2 * | 8/2006 | Yun et al. | ....................... | 714/790 |
| 7,093,185 B2 * | 8/2006 | Kim et al. | ....................... | 714/790 |
| 7,242,726 B2 * | 7/2007 | Cameron et al. | ............. | 375/295 |
| 7,421,034 B2 * | 9/2008 | Cameron et al. | ............. | 375/265 |
| 7,827,473 B2 * | 11/2010 | Lee et al. | ....................... | 714/794 |
| 7,890,834 B2 * | 2/2011 | Blankenship et al. | ........ | 714/755 |
| 7,924,763 B2 * | 4/2011 | Nimbalker et al. | ........... | 370/315 |
| 8,069,387 B2 * | 11/2011 | Shen et al. | ..................... | 714/755 |
| 8,112,697 B2 * | 2/2012 | Anand et al. | .................. | 714/790 |
| 2006/0160347 A1 | 7/2006 | Nakayama et al. | | |
| 2008/0320353 A1 | 12/2008 | Blankenship et al. | | |

FOREIGN PATENT DOCUMENTS

KR 10-0735433 6/2007
KR 10-2008-0010736 1/2008

* cited by examiner

*Primary Examiner* — Stephen Baker
(74) *Attorney, Agent, or Firm* — Lee, Hong, Degerman, Kang & Waimey

(57) ABSTRACT

An apparatus and method for transmitting a signal using a bit grouping method in a wireless communication system is disclosed. Interleaved subblocks are maintained, and output bit sequences are modulated in due order after bit grouping and bit selection. The bit grouping method is advantageous in that bit reliability is uniformly distributed.

12 Claims, 15 Drawing Sheets

APPARATUS AND METHOD FOR TRANSMITTING SIGNAL USING BIT GROUPING IN WIRELESS COMMUNICATION SYSTEM

CROSS-REFERENCE TO RELATED APPLICATIONS

Pursuant to 35 U.S.C. §119(e), this application claims the benefit of priority to Provisional Application No. 61/149,317, filed on Feb. 2, 2009, Provisional Application No. 61/157,196, filed on Mar. 3, 2009, and korean application No. 10-2009-0067727, filed on Jul. 24, 2009, the contents of which are incorporated by reference herein in their entirety.

FIELD OF THE INVENTION

The present invention relates to an apparatus and method for transmitting a signal, and more particularly, to an apparatus and method for transmitting a signal using a bit grouping method.

DISCUSSION OF THE RELATED ART

Hereinafter, a bit grouping procedure in an IEEE (Institute of Electrical and Electronics Engineers) 802.16m system will be described in brief.

FIG. 1 is a block diagram illustrating a bit grouping method according to the related art.

First of all, bit separation will be described with reference to FIG. 1. Encoded bits output from a convolutional turbo code (CTC) encoder are all demultiplexed to six subblocks A, B, Y1, Y2, W1 and W2. The output bits are continuously distributed into six subblocks, wherein N number of first output bits are distributed into the subblock A, N number of second output bits are distributed into the subblock B, N number of third output bits are distributed into the subblock Y1, N number of fourth output bits are distributed into the subblock Y2, N number of fifth output bits are distributed into the subblock W1, and N number of sixth output bits are distributed into the subblock W2.

Subblock interleaving will be described. The six subblocks will be interleaved separately using the same subblock interleaver. In this case, interleaving is performed in a unit of bit. Output sequences of bit grouping include interleaved subblock A and B sequences, bit-by-bit multiplexed sequences of interleaved Y1 and Y2 subblock sequences bit-by-bit, and bit-by-bit multiplexed sequences of interleaved W1 and W2 subblock sequences.

The interleaved output bit sequences of each subblock are generated by a procedure described below.

All subblocks of bits to be interleaved are written in an array with addresses 0 to N−1 (i.e., bits−1), and the interleaved bits are read out from the $i^{th}$ bit of addresses ($A_{Di}$, wherein i=0, ..., N−1) in a permuted order.

The aforementioned CTC bit grouping method according to the related art has a problem in that bit reliability is not distributed uniformly. In case of high order modulation (for example, 16QAM or 64QAM), codeword sequences are mapped with bit reliability of level 2 or level 3 depending on a modulation level. In view of a decoder, the bit grouping method of the related art has a problem in that bit reliability of systematic bits and parity bits is not distributed uniformly in accordance with each decoding trellis transition.

SUMMARY OF THE INVENTION

Accordingly, the present invention is directed to an apparatus and method for transmitting a signal using a bit grouping method in a wireless communication system, which substantially obviates one or more problems due to limitations and disadvantages of the related art.

An object of the present invention is to provide an apparatus for transmitting a signal using a bit grouping method.

Another object of the present invention is to provide a method for transmitting a signal using a bit grouping method.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for transmitting a signal using bit grouping in a wireless communication system comprises mapping systematic bits of output bits of a convolutional turbo code (CTC) encoder to first and second subblocks and mapping parity bits of the output bits to third to sixth subblocks; performing subblock interleaving for each of the first to sixth subblocks; performing circularly shifting the interleaved first subblock by a predetermined bit; generating output sequences using the bits of the circularly-shifted first subblock and the bits of the interleaved second to sixth subblocks; and transmitting the output sequences.

In another aspect of the present invention, an apparatus for transmitting a signal using bit grouping in a wireless communication system comprises a mapper mapping systematic bits of output bits of a convolutional turbo code (CTC) encoder to first and second subblocks and mapping parity bits of the output bits to third to sixth subblocks; an subblock interleaver performing subblock interleaving for each of the first to sixth subblocks; a circular-shift module performing circularly shifting the interleaved first subblock by a predetermined bit; a bit grouping output sequence generation module generating output sequences using the bits of the circularly-shifted first subblock and the bits of the interleaved second to sixth subblocks; and a transmission module transmitting the output sequences.

The bit grouping method according to the embodiments of the present invention has advantages in that it is similar to the bit grouping method of the related art in view of complexity and bit reliability is uniformly distributed.

Also, owing to such advantages, it is advantageous in that more exact data or signal transmission can be performed.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
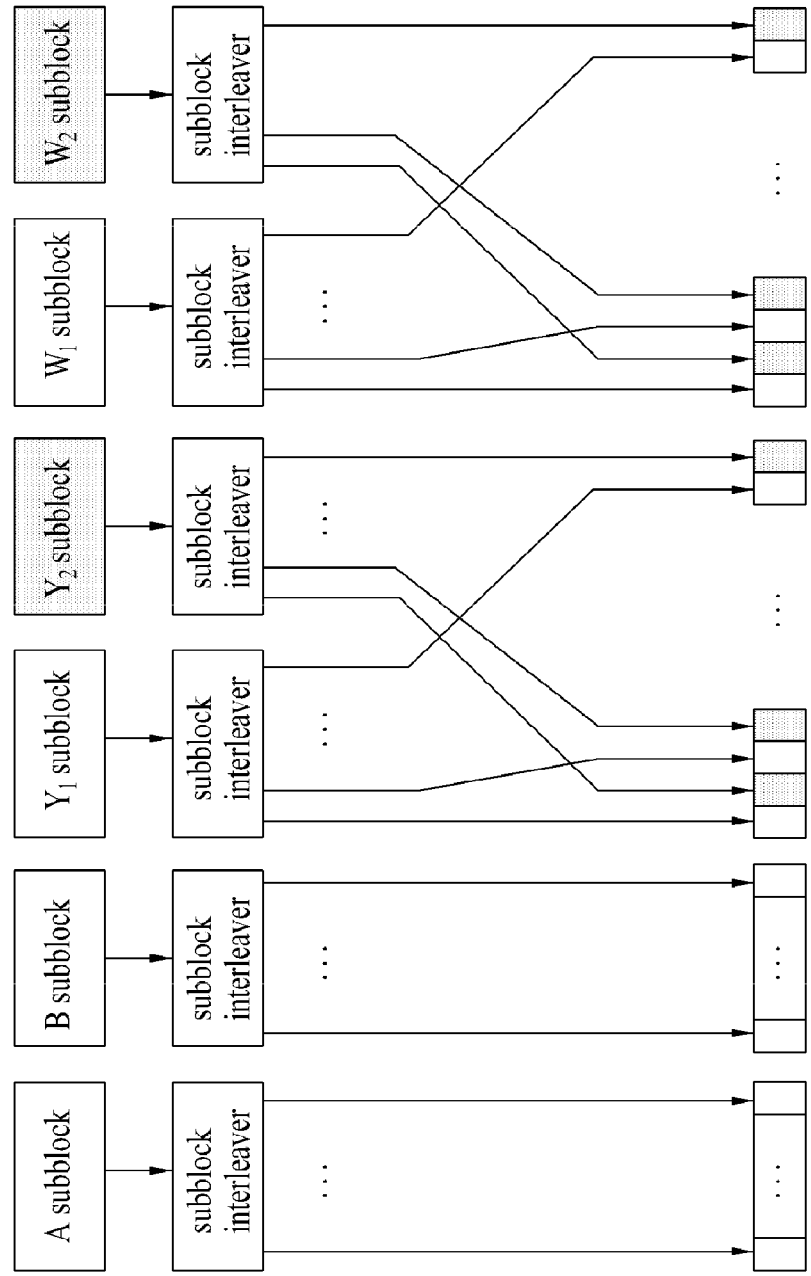
FIG. 1 is a block diagram illustrating a bit grouping method according to the related art.

Hereinafter, the preferred embodiments of the present invention will be described with reference to the accompanying drawings. It is to be understood that the detailed description, which will be disclosed along with the accompanying drawings, is intended to describe the exemplary embodiments of the present invention, and is not intended to describe a unique embodiment with which the present invention can be carried out. The following detailed description includes detailed matters to provide full understanding of the present invention. However, it will be apparent to those skilled in the art that the present invention can be carried out without the detailed matters. For example, the following description will be made based on, but not limited to, some terminologies. And, other random terminologies may be designated to refer to the same meaning. Wherever possible, the same reference numbers will be used throughout the drawings to refer to the same or like parts.

In the description, when some part "includes" some element, unless specified otherwise, it means that the corresponding part may further include any other element.

The technology disclosed hereinafter can be used for various communication systems that can provide various communication services such as voice and packet data. The technology of the communication system can be used in a downlink or uplink. A base station may be replaced with terms such as a fixed station, Node B, eNode B (eNB), access point, and ABS. Also, a mobile station may be replaced with terms such as a user equipment (UE), a subscriber station (SS), a mobile subscriber station (MSS), AMS, and a mobile terminal.

Furthermore, a transmitting side means a node that transmits data services or voice services while a receiving side means a node that receives data services or voice services. Accordingly, in the uplink, the mobile station could be a transmitting side while the base station could be a receiving side. Likewise, in the downlink, the mobile station could be a receiving side while the base station could be a transmitting side.

Meanwhile, in the present invention, examples of the mobile station include a personal digital assistant (PDA), a cellular phone, a personal communication service (PCS) phone, a global system for mobile (GSM) phone, a wideband CDMA (WCDMA) phone, and a mobile broadband system (MBS) phone.

The embodiments of the present invention can be supported by standard documents disclosed in at least one of wireless access systems, i.e., IEEE 802 system, 3GPP system, 3GPP LTE system, and 3GPP2 system. Namely, among the embodiments of the present invention, steps or parts which are not described to clarify technical spirits of the present invention can be supported by the above standard documents. Also, all terminologies disclosed herein can be described by the above standard documents. Particularly, the embodiments of the present invention can be supported by one or more of standard documents of the IEEE 802.16 system, i.e., P802.16-2004, P802.16e-2005 and P802.16Rev2 etc.

Figure 2:
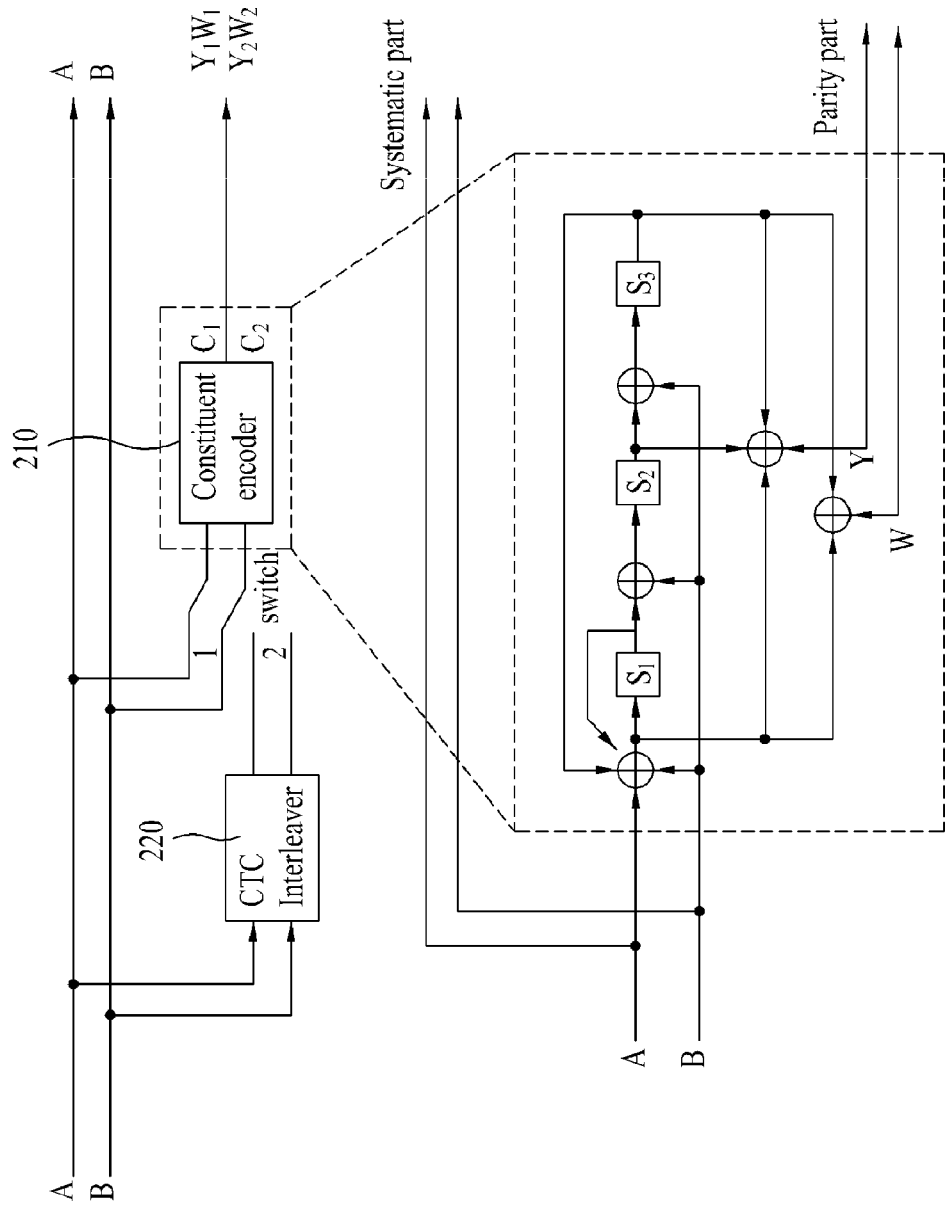
FIG. 2 is a diagram illustrating a CTC encoder.

FIG. 2 is a diagram illustrating configuration of a convolutional turbo code (CTC) encoder.

Referring to FIG. 2, the CTC encoder encodes data bits input through its two input terminals and the CTC encoder outputs systematic bits A and B and parity bits Y1, Y2, W1 and W2. The encoded bits are output from the CTC encoder in the order as expressed by the following Equation 1.

$$A, B, Y_1, Y_2, W_1, W_2 = A_0, A_1, A_2, \ldots, A_{N-1}, B_0, B_1,$$
$$B_2, \ldots, B_{N-1}, Y_{1,0}, Y_{1,1}, Y_{1,2}, \ldots, Y_{1,N-1}, Y_{2,0}, Y_{2,1},$$
$$Y_{2,2}, \ldots, Y_{2,N-1}, W_{1,0}, W_{1,1}, W_{1,2}, \ldots, W_{1,N-1}, W_{2,0},$$
$$W_{2,1}, W_{2,2}, \ldots, W_{2,N-1}$$ [Equation 1]

According to a block diagram of a bit grouping method suggested in the present invention, it is assumed that a subblock structure of the related art is maintained but output bit sequences are modulated in due order after bit grouping is performed and bits are selected. Hereinafter, a bit grouping method for uniformly distributing bit reliability in an IEEE 802.16m system will be described.

Figure 3:
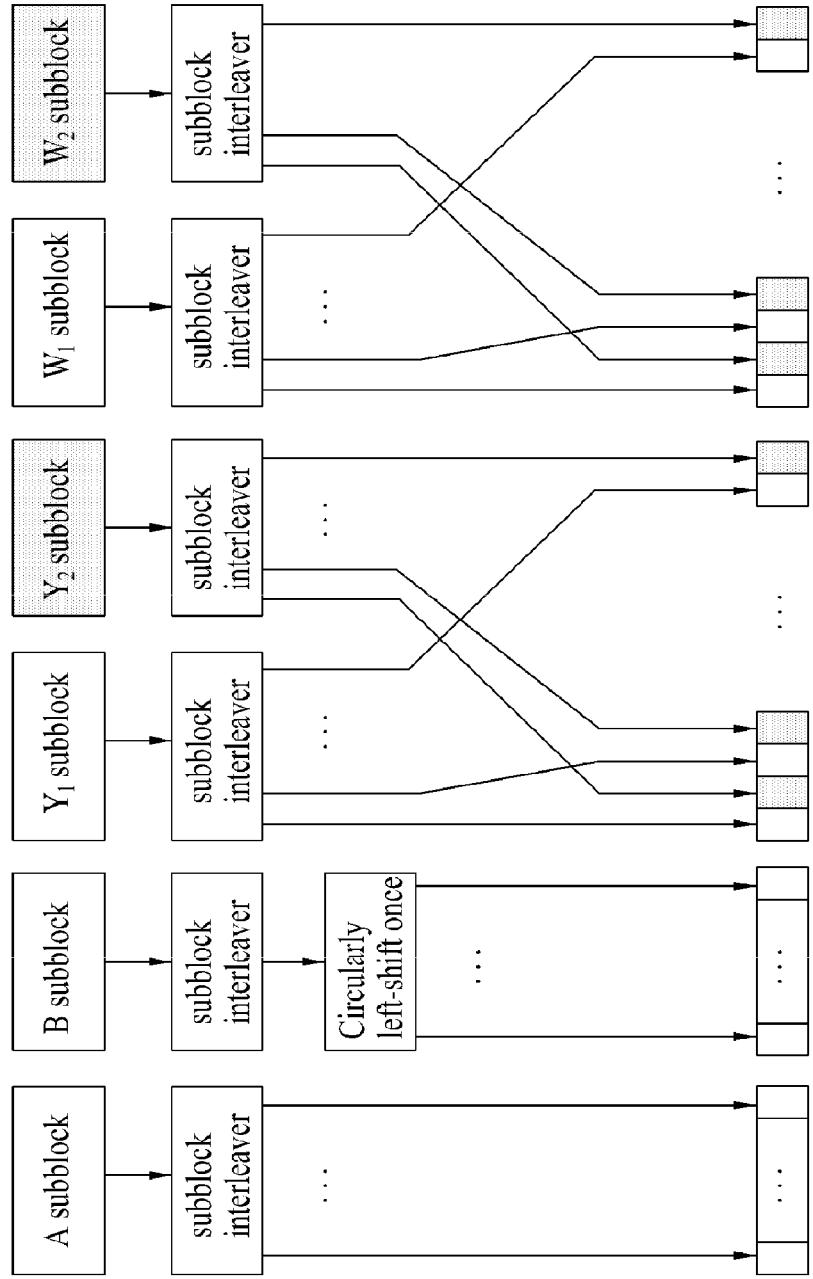
FIG. 3 is a block diagram illustrating an example of a new bit grouping method in an IEE 802.16m system.
Figure 4:
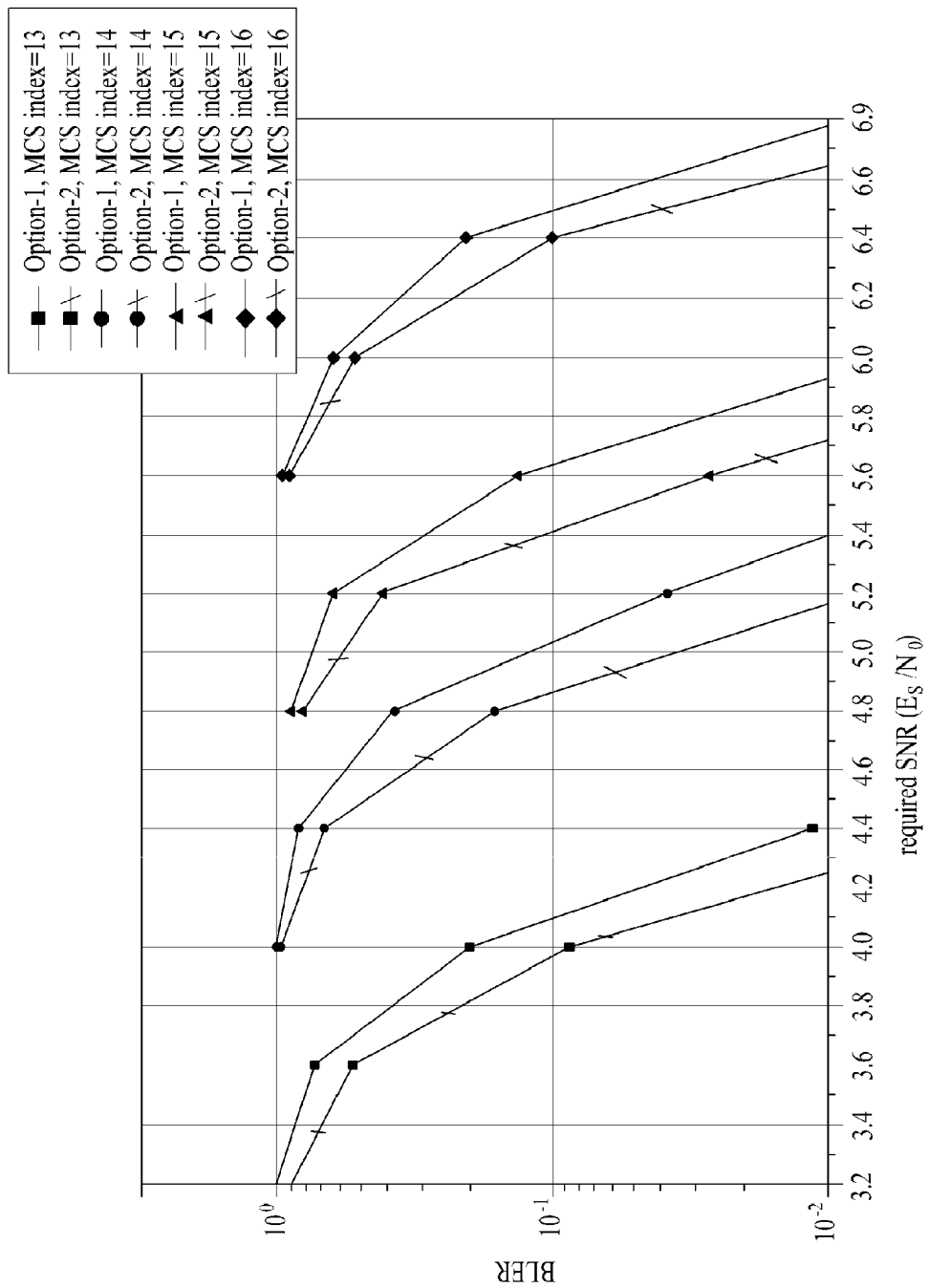
FIG. 4 to FIG. 8 are diagrams illustrating results of simulation using indexes 13 to 31 of MCS indexes of Table 2.
Figure 5:
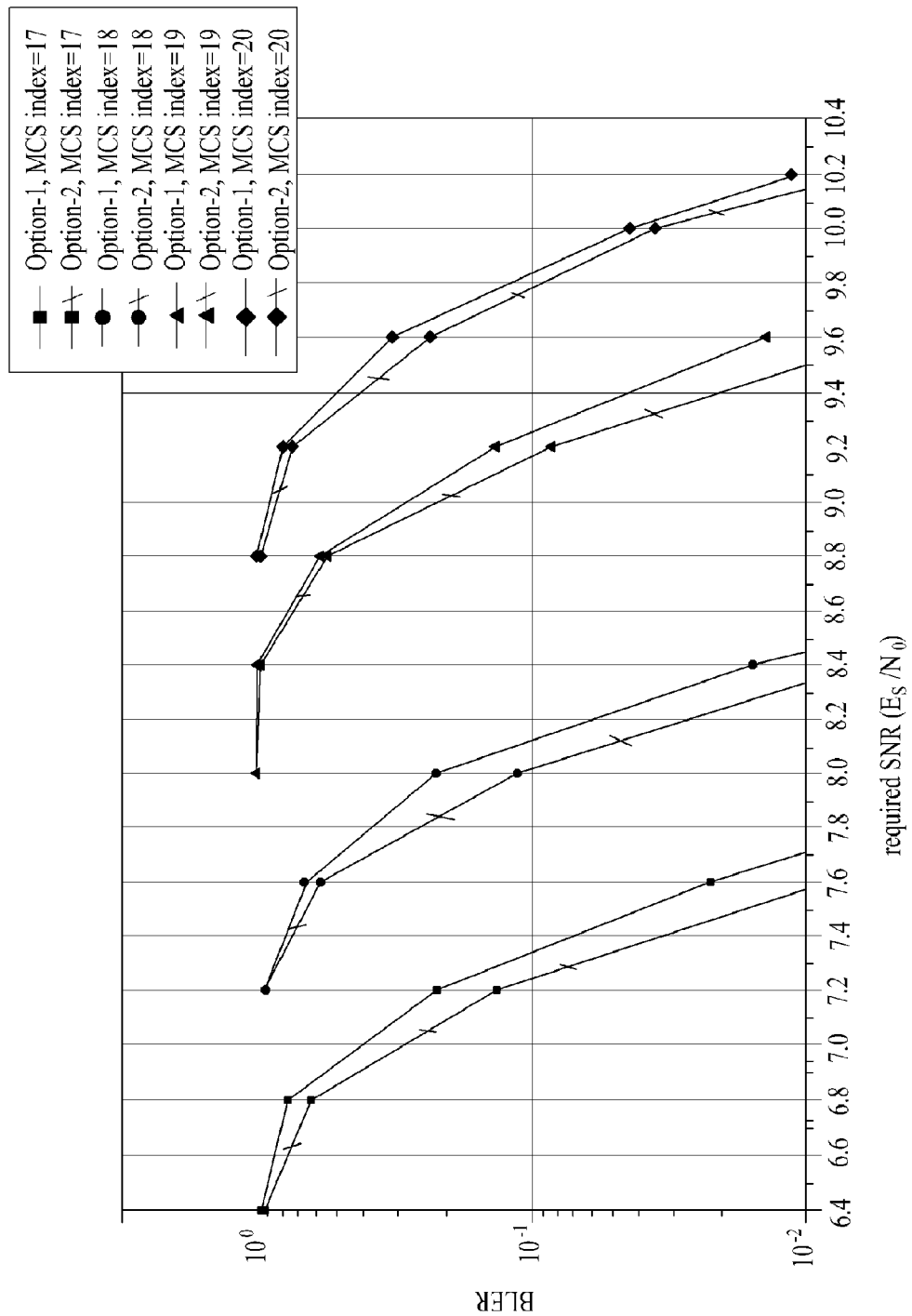
Figure 6:
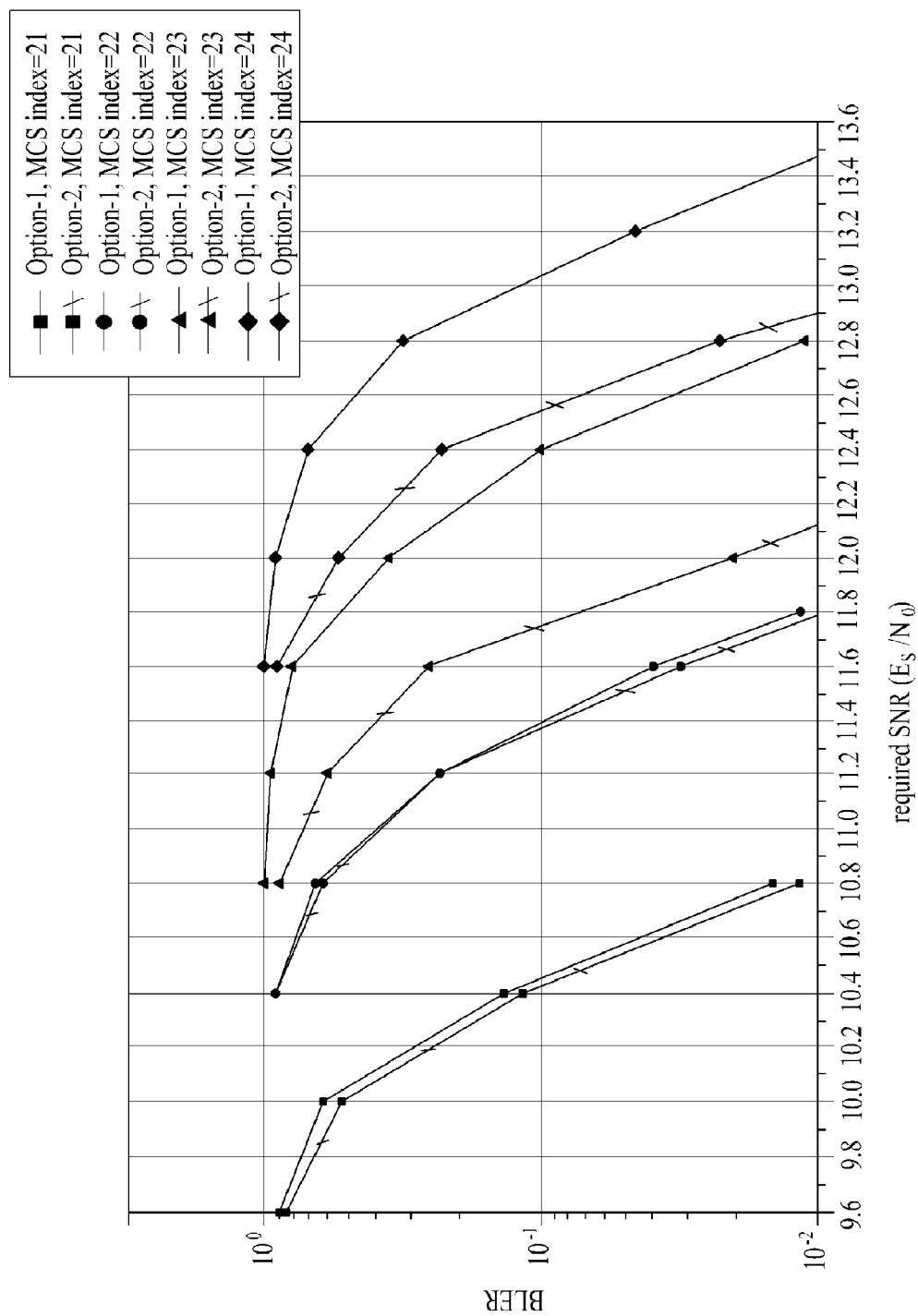
Figure 7:
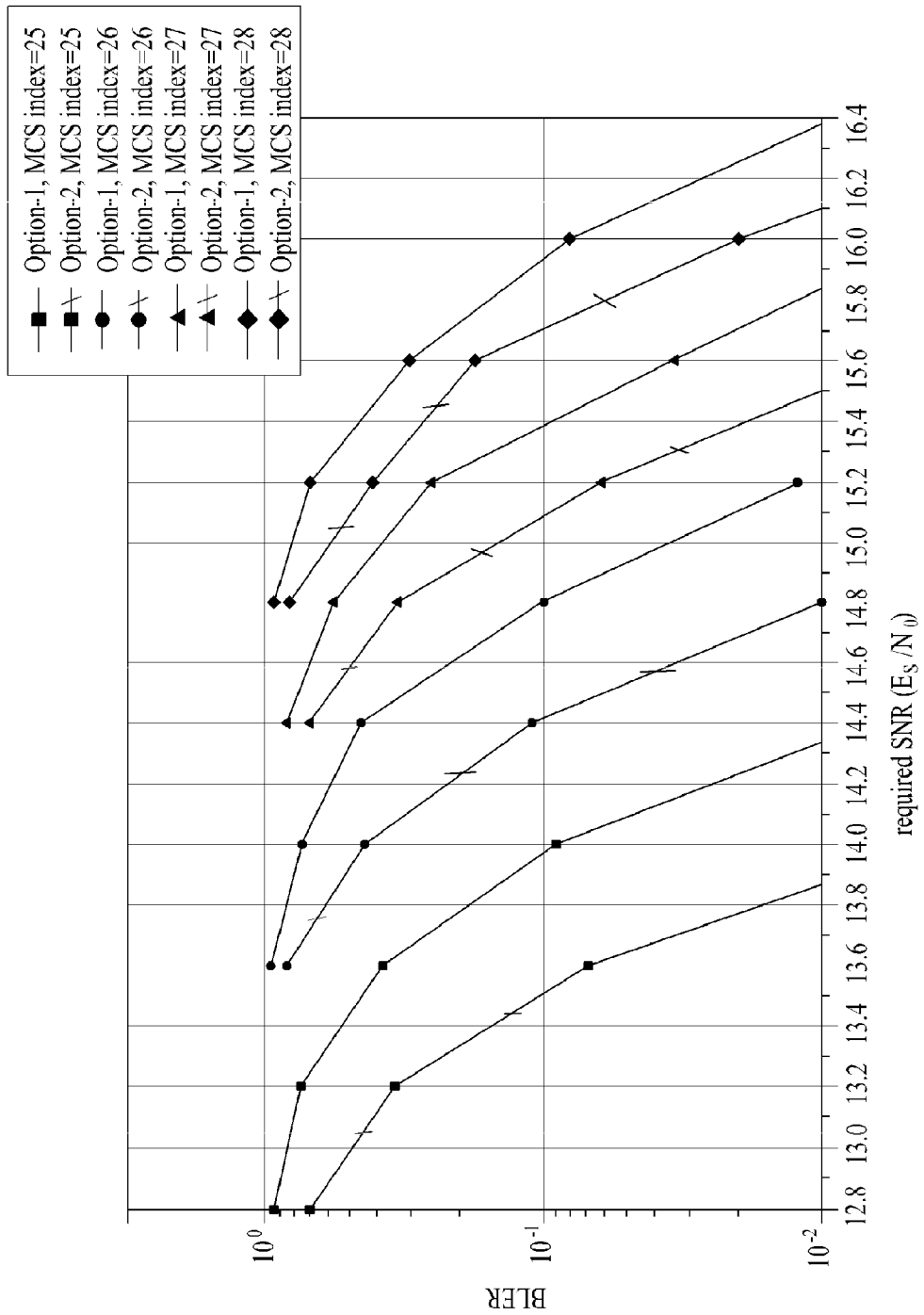
Figure 8:
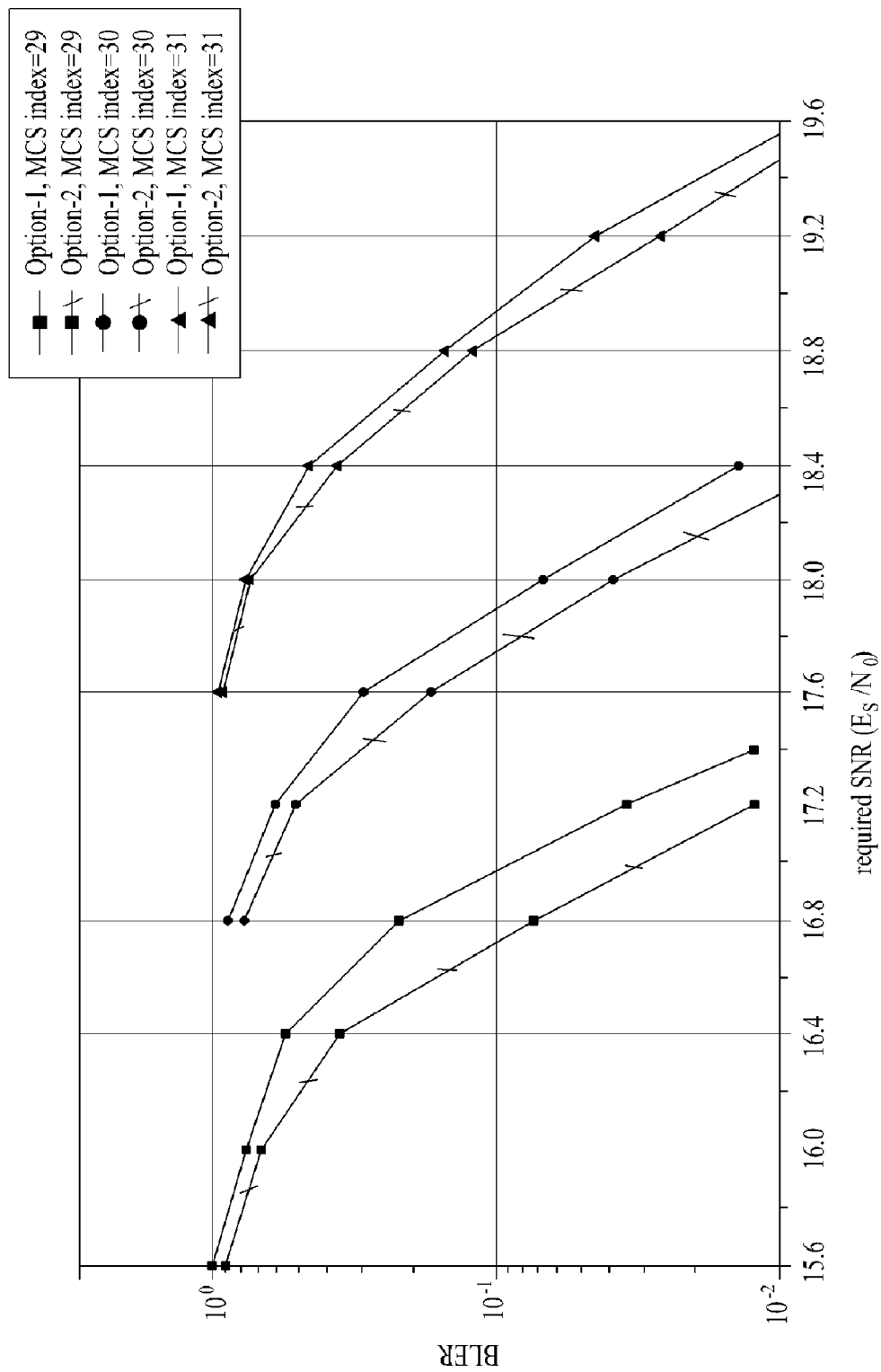

FIG. 3 is a block diagram illustrating an example of a new bit grouping method in an IEE 802.16m system.

According to one embodiment of the present invention, interleaved sequences of the subblock B are circularly left-shifted by 1 bit in accordance with a rule of the following Equation 2. Hereinafter, in the present invention, a bit grouping method based on circularly left-shifting by 1 bit for the interleaved sequences of the subblock B will be referred to as the first embodiment.

$$B_{shift}(i) = B((i+1) \bmod N), \text{ wherein } i=0,1,\ldots,N-1).$$ [Equation 2]

The output sequences of bit grouping according to the first embodiment include interleaved subblock A sequences and circularly shifted $B_{shift}$ subblock sequences, bit-by-bit multiplexed (or interlaced) sequences of interleaved subblock Y1 and Y2 sequences, and bit-by-bit multiplexed sequences of interleaved subblock W1 and W2 sequences. Bit reliability obtained after the interleaved sequences of the subblock B are circularly left-shifted by 1 bit in accordance with the above rule is illustrated in Table 1. Table 1 is a table that compares bit reliability according to the bit grouping method of the related art with bit reliability according to the bit grouping method of the first embodiment in view of decoder.

TABLE 1

| Subblocks | | Bit Reliability | |
|---|---|---|---|
| | | 16e Bit grouping | Proposed Bit grouping |
| DEC #1 | A | 000011111111000000001111 | 000011111111000000001111 |
| | B | 000011111111000000001111 | 111100000000111111110000 |
| | Sum | 000022222222000000002222 | 111111111111111111111111 |
| DEC #2 | A' | 001110100101011010001101 | 100100001111110000100111 |
| | B' | 001110100101011010001101 | 011011110000001111011000 |
| | Sum | 002220200202022020002202 | 111111111111111111111111 |

Referring to Table 1, a Forward Error Correction (FEC) block size (NEP) is set to 48, and 16 QAM (Quadrature Amplitude Modulation) is used. Table 1 illustrates bit reliability values of 24 bit subblock sequences for each subblock. In this case, '0' represents low bit reliability, and '1' represents high bit reliability. A' and B' mean bit reliability values of subblock sequences after CTC inner interleaving is applied. 'Sum' means a sum of bit reliability values for each decoding trellis transition. As illustrated in Table 1, after the interleaved sequences of the subblock B are circularly left-shifted by 1 bit, a sum of bit reliability values is obtained. As a result, it is noted that 'Sum' is expressed as 1 and bit reliability is uniformly distributed along each decoding trellis transition.

Also, the FEC block size (NEP) is set to 960, and simulation has been performed for a bit grouping method (option 1) of the related art and a new bit grouping method (option 2) of the first embodiment. In this case, a decoding algorithm performs Max-Log-MAP algorithm with 8 iterations and a scaling factor is set to 0.75. Also, 19 modulation and coding scheme (MCS) levels are used. At this time, the MCS uses indexes 13 to 31 in MCS table as illustrated in Table 2. And, an Additive White Gaussian Noise (AWGN) channel is used, and corresponds to a channel having general noise.

TABLE 2

| MCS level index | Modulation | Code rate |
|---|---|---|
| 0 | QPSK | 22/256 |
| 1 | QPSK | 27/256 |
| 2 | QPSK | 31/256 |
| 3 | QPSK | 39/256 |
| 4 | QPSK | 48/256 |
| 5 | QPSK | 58/256 |
| 6 | QPSK | 70/256 |
| 7 | QPSK | 89/256 |
| 8 | QPSK | 104/256 |
| 9 | QPSK | 121/256 |
| 10 | QPSK | 137/256 |
| 11 | QPSK | 150/256 |
| 12 | QPSK | 164/256 |
| 13 | 16QAM | 89/256 |
| 14 | 16QAM | 104/256 |
| 15 | 16QAM | 113/256 |
| 16 | 16QAM | 128/256 |
| 17 | 16QAM | 142/256 |
| 18 | 16QAM | 154/256 |
| 19 | 16QAM | 174/256 |
| 20 | 16QAM | 183/256 |
| 21 | 16QAM | 193/256 |
| 22 | 16QAM | 207/256 |
| 23 | 64QAM | 141/256 |
| 24 | 64QAM | 151/256 |
| 25 | 64QAM | 164/256 |
| 26 | 64QAM | 177/256 |
| 27 | 64QAM | 186/256 |

TABLE 2-continued

| MCS level index | Modulation | Code rate |
|---|---|---|
| 28 | 64QAM | 193/256 |
| 29 | 64QAM | 206/256 |
| 30 | 64QAM | 219/256 |
| 31 | 64QAM | 231/256 |

FIG. 4 to FIG. 8 are diagrams illustrating results of simulation using indexes 13 to 31 in MCS indexes of the Table 2.

Specifically, FIG. 4 to FIG. 8 illustrate results of simulation using MCS indexes 13 to 16, MCS indexes 17 to 20, MCS indexes 21 to 24, MCS indexes 25 to 28, and MCS indexes 29 to 31, respectively. In this case, option 1 means the simulation result according to the bit grouping method of the related art, and option 2 means the simulation result according to the bit grouping method suggested in the present invention.

As illustrated in FIG. 4 to FIG. 8, a signal to noise ratio (SNR) required for the same block error rate (BLER) in accordance with the bit grouping method (option 1) of the related art is greater than that required for the first embodiment of the present invention. Namely, this represents that the bit grouping according to the first embodiment has more excellent performance than that of the bit grouping method of the related art.

The simulation result according to the first embodiment will be described in detail. After a modulation scheme is set to 16QAM, simulation is performed. As a result, it is noted that simulation performance according to the first embodiment is more excellent than that of the bit grouping method in the IEEE 802.16m system of the related art. At this time, gain of 0.1 to 0.2 dB can be obtained. Likewise, if simulation is performed after a modulation scheme is set to 64QAM, it is noted that the simulation performance is more excellent than that of the bit grouping method in the IEEE 802.16m system of the related art. At this time, gain of 0.1 to 0.7 dB can be obtained.

If the bit grouping method according to the first embodiment is compared with the bit grouping method of the related art in view of complexity, since one circularly-shifted block is added to the interleaved sequences of the subblock B, it is regarded that additional complexity is negligible.

Figure 9:
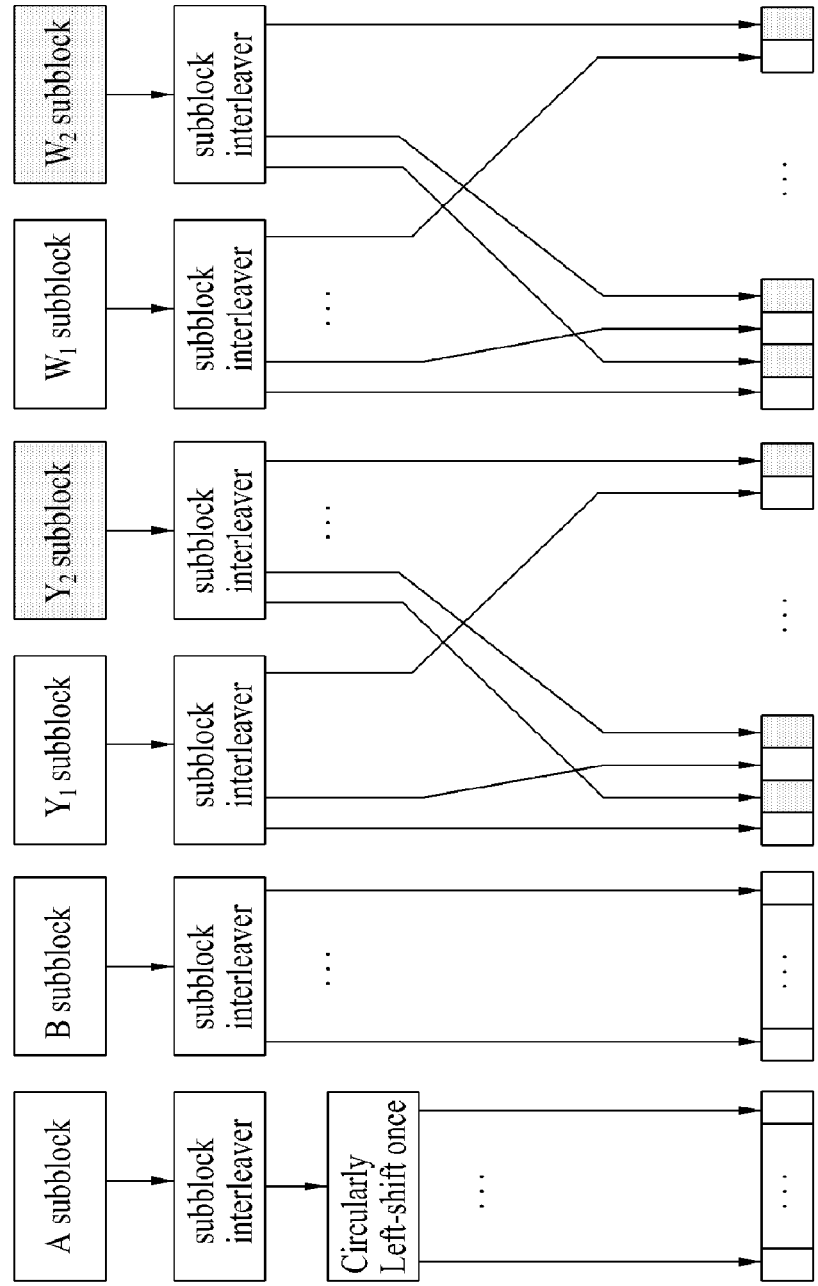
FIG. 9 is a block diagram illustrating another example of a new bit grouping method in an IEE 802.16m system.

FIG. 9 is a block diagram illustrating another example of a new bit grouping method in an IEE 802.16m system.

According to another embodiment of the present invention, interleaved sequences of the subblock A are circularly left-shifted by 1 bit in accordance with a rule of the following Equation 3. Hereinafter, a bit grouping method based on circularly left-shifted by 1 bit for the interleaved sequences of the subblock A will be referred to as the second embodiment.

$$A_{shift}(i)=A((i+1) \bmod N), \text{ wherein } i=0, N-1).$$  [Equation 3]

Referring to FIG. 9, the output sequences of new bit grouping according to the second embodiment include circularly shifted $A_{shift}$ sequences and interleaved subblock B sequences, bit-by-bit multiplexed (or interlaced) sequences of interleaved subblock Y1 and Y2 sequences, and bit-by-bit multiplexed sequences of interleaved subblock W1 and W2 sequences. The grouping method according to the second embodiment, as illustrated in FIG. 4 to FIG. 8, has the same result as that of the first embodiment. Namely, if the bit grouping method according to the second embodiment is performed, bit reliability is distributed more uniformly than that of the bit grouping method according to the related art, whereby excellent performance can be obtained.

Figure 10:
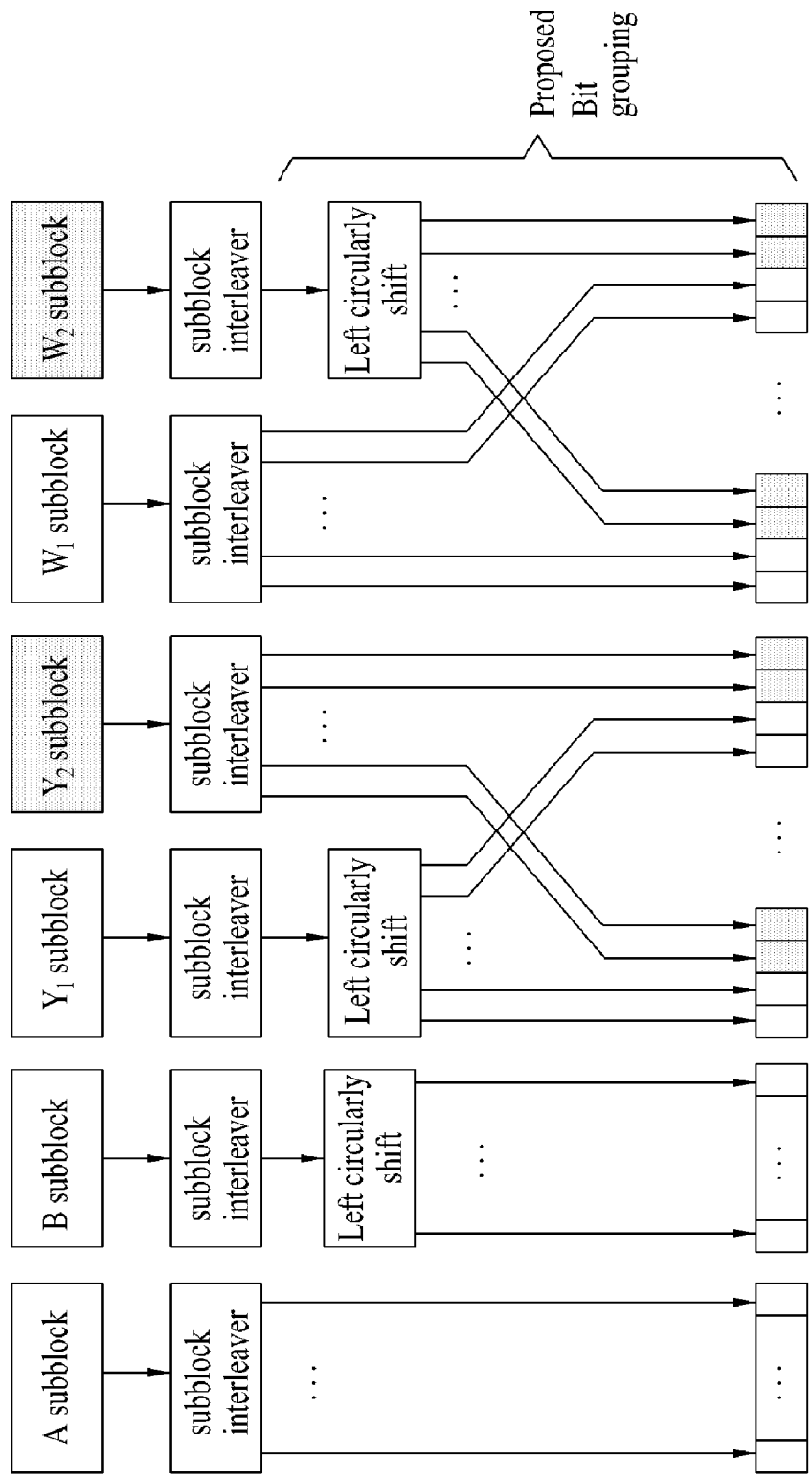
FIG. 10 is a block diagram illustrating another example of a new bit grouping method in an IEE 802.16m system.

FIG. 10 is a block diagram illustrating another example of a new bit grouping method in an IEE 802.16m system.

According to another embodiment of the present invention, interleaved sequences of the subblock B, the subblock Y1, and the subblock W2 may be circularly left-shifted by 1 bit, respectively in accordance with a rule of the following Equation 4. Hereinafter, a new bit grouping method suggested as above will be referred to as the third embodiment.

$B_{shift}(i)=B((i+1) \bmod N)$, $Y1_{shift}(i)=Y1((i+1) \bmod N)$, $W2_{shift}(i)=W2((i+1) \bmod N)$,  [Equation 4]

wherein, i=0, 1, ..., N−1.

Referring to FIG. 10, the output sequences of new bit grouping according to the third embodiment include interleaved subblock A sequences and circularly-shifted $B_{shift}$ subblock sequences, bit-by-bit multiplexed (or interlaced) sequences of circularly-shifted $Y1_{shift}$ subblock sequences and interleaved subblock Y2 sequences, and bit-by-bit multiplexed sequences of interleaved subblock W1 sequences and circularly-shifted $W2_{shift}$ subblock sequences. In this case, it may be considered that the sequences are bit-by-bit multiplexed, wherein 2 bits are set to one unit.

The bit-by-bit multiplexed sequences of the Y1 and Y2 subblock sequences include 2 bits of a first unit to which a circular-shift version for the interleaved Y1 subblock sequences is applied, 2 bits of the first unit from the interleaved Y2 subblock sequences, 2 bits of a second unit to which a circular-shift version of the interleaved Y1 subblock sequences is applied, and 2 bits of the second unit from the interleaved Y2 subblock sequences.

The bit-by-bit multiplexed sequences of the W1 and W2 subblock sequences include 2 bits of a first unit from the interleaved W1 subblock sequences, 2 bits of the first unit to which a circular-shift version of the interleaved W2 subblock sequences, 2 bits of a second unit from the interleaved W1 subblock sequences, and 2 bits of the second unit to which a circular-shift version for the interleaved W2 subblock sequences is applied.

Bit reliability obtained after the interleaved sequences of the subblocks B, Y1 and W2 are circularly left-shifted by 1 bit in accordance with the rule of the Equation 3 is illustrated in Table 3. Table 3 is a table that compares bit reliability according to the bit grouping method of the related art with bit reliability according to the bit grouping method of the third embodiment in view of decoder.

TABLE 3

| Subblocks | | Bit Reliability | |
|---|---|---|---|
| | | Legacy Bit grouping | Proposed Bit grouping |
| DEC #1 | A | 000011111111000000001111 | 000011111111000000001111 |
| | B | 000011111111000000001111 | 111100000000111111110000 |
| | Y1 | 000000000000000000000000 | 111100000000111111110000 |
| | W1 | 000000000000000000000000 | 000011111111000000001111 |
| | Sum | 000022222222000000002222 | 222222222222222222222222 |
| DEC #2 | A' | 001101010010101101000101 | 100100001111110000100111 |
| | B' | 001101010010101101000101 | 011011110000001111011000 |
| | Y2 | 111111111111111111111111 | 000011111111000000001111 |
| | W2 | 111111111111111111111111 | 111100000000111111110000 |
| | Sum | 224442422424244242224424 | 222222222222222222222222 |

Referring to Table 3, a Forward Error Correction (FEC) block size (NEP) is set to 480, and 16 QAM (Quadrature Amplitude Modulation) and a coding rate of 1/3 are used. Table 3 illustrates bit reliability values of 24 bit subblock sequences for each subblock. In this case, '0' represents low bit reliability, and '1' represents high bit reliability. A' and B' mean bit reliability values of subblock sequences after CTC inner interleaving is applied. 'Sum' means a sum of bit reliability values for each decoding trellis transition.

As illustrated in Table 1, after the interleaved sequences of the subblocks B, Y1, and W2 are circularly left-shifted by 1 bit, a sum of bit reliability values for each decoding trellis transition is obtained. As a result, it is noted that bit reliability is uniformly distributed along each decoding trellis transition.

Also, the FEC block size (NEP) is set to 960, and simulation has been performed for a bit grouping method (option 1) of the related art and a new bit grouping method (option 2) of the third embodiment. In this case, a coding rate is 1/3 or 1/2, and a quadrature phase shift keying (QPSK), 16QAM, or 64QAM is used as a modulation scheme. Also, decoding is repeated eight times, a scaling factor is supposed to 0.75, and the simulation is performed using a decoding algorithm that performs Max-Log-MAP decoding. Moreover, an Additive White Gaussian Noise (AWGN) channel is used, and corresponds to a channel having general noise.

Figure 11:
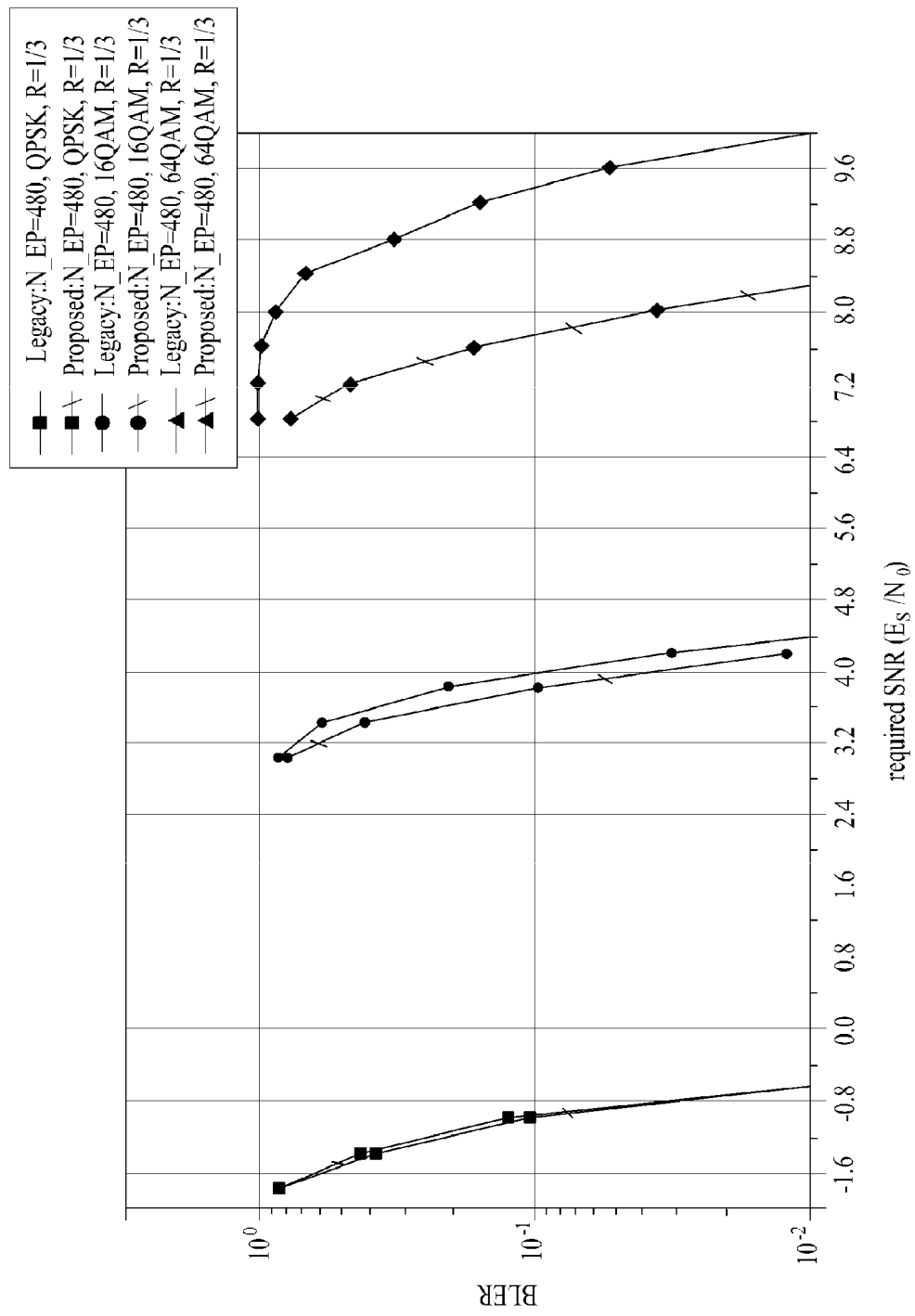
FIG. 11 and FIG. 12 are diagrams illustrating results of simulation using a bit grouping method according to the related art and a bit grouping method according to the third embodiment of the present invention.
Figure 12:
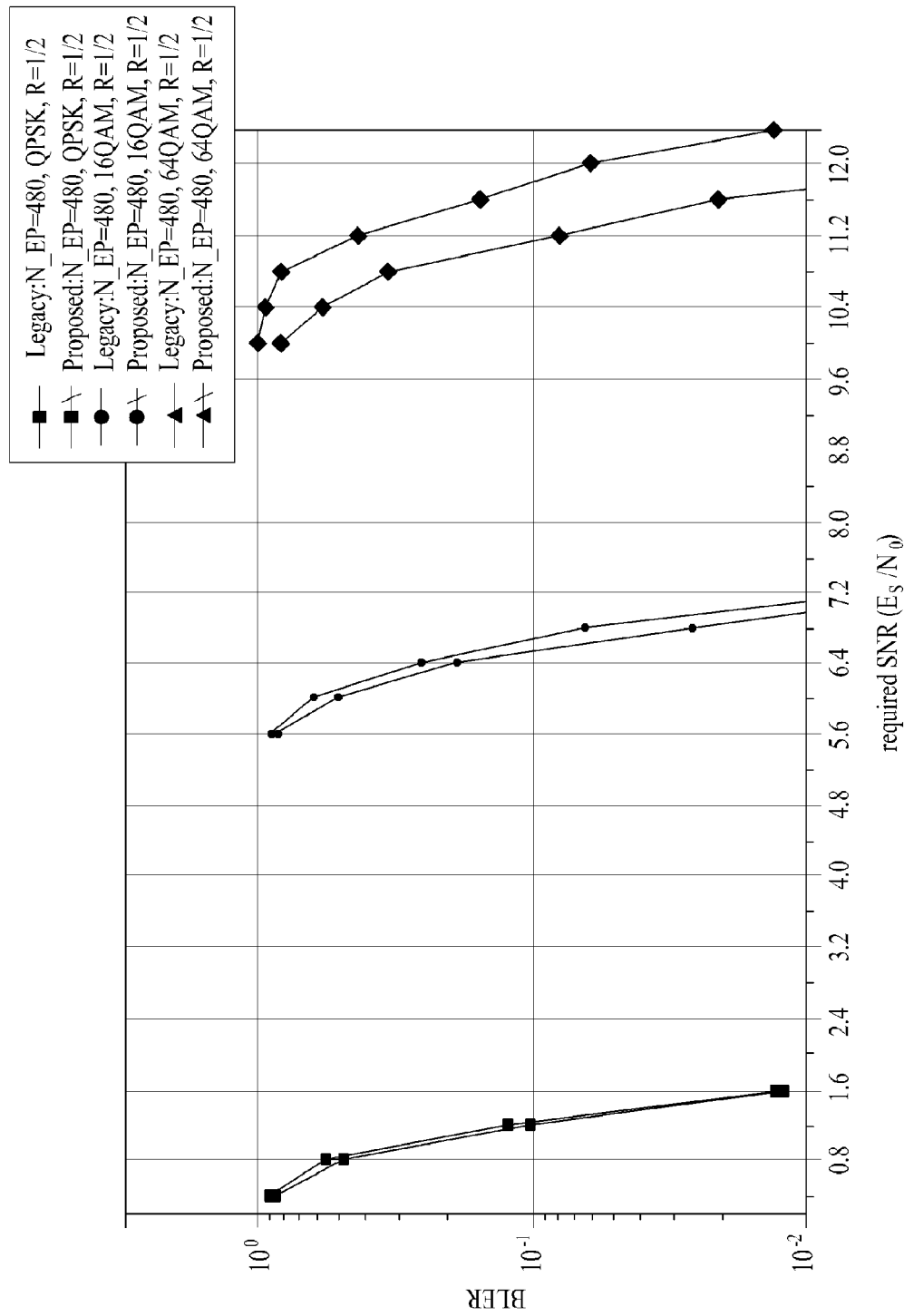

FIG. 11 and FIG. 12 are diagrams illustrating results of simulation using a bit grouping method according to the related art and a bit grouping method according to the third embodiment of the present invention.

Referring to FIG. 11 and FIG. 12, "legacy" represents the simulation result according to the bit grouping method of the related art, and "proposed" represents the simulation result according to the bit grouping method of the present invention. In FIG. 11, the simulation result is illustrated using a coding rate of ⅓, a forward error correction (FEC) block size (NEP) set to 480, and modulation schemes such as QPSK, 16QAM and 64QAM. In FIG. 12 as compared with FIG. 11, the simulation result is illustrated using a coding rate of ½, and the other conditions of FIG. 12 are identical with those of FIG. 11.

As illustrated in FIG. 11 and FIG. 12, it is noted that a signal to noise ratio (SNR) required for the same block error rate (BLER) in accordance with the bit grouping method of the related art is greater than that required for the third embodiment of the present invention. Namely, this represents that the bit grouping according to the third embodiment has performance more excellent than that of the bit grouping method of the related art.

The simulation result according to the third embodiment will be described in detail. In case of the bit grouping method according to the third embodiment, it is noted that bit reliability is more uniformly distributed along each decoding trellis transition and BLER is more improved in case of a high modulation level than the bit grouping method according to the related art.

Figure 13:
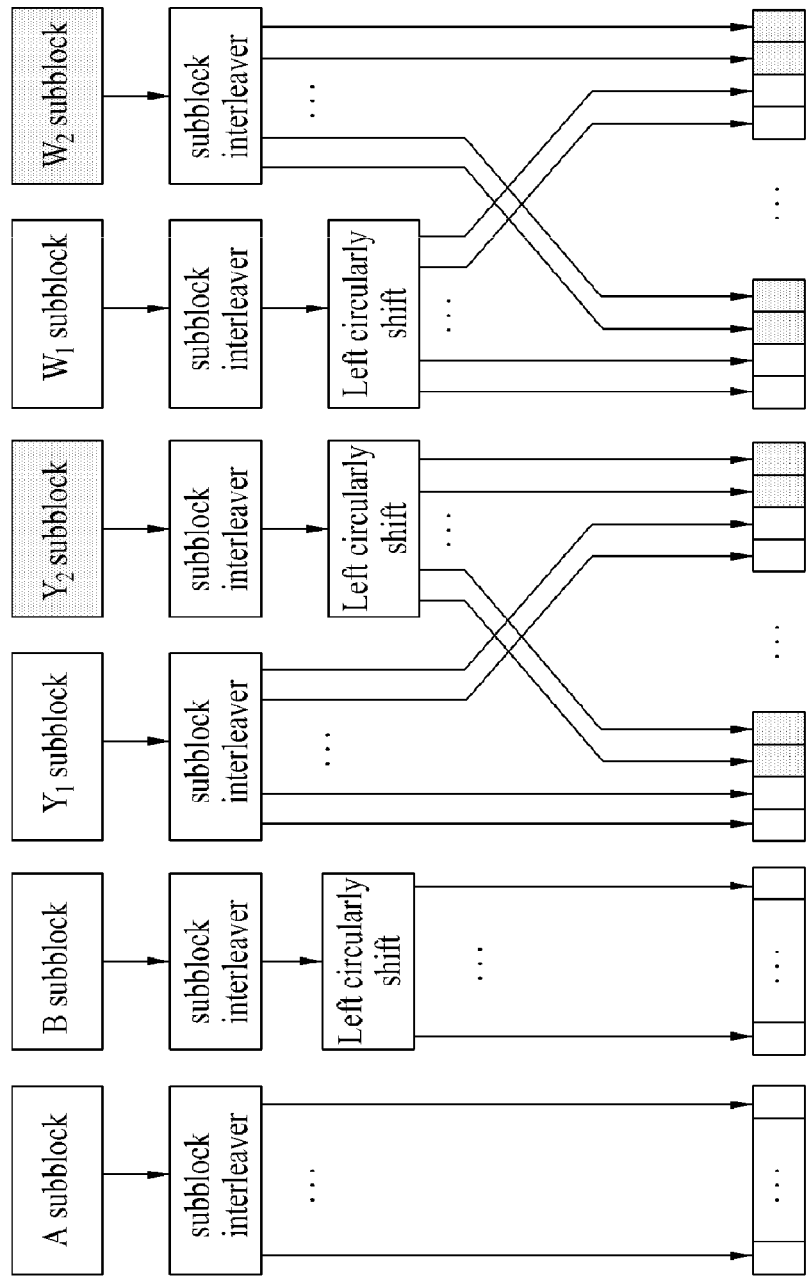
FIG. 13 is a block diagram illustrating another example of a new bit grouping method in an IEE 802.16m system.

FIG. 13 is a block diagram illustrating another example of a new bit grouping method in an IEE 802.16m system.

According to another embodiment of the present invention, interleaved sequences of the subblock B, the subblock Y2 and the subblock W1 are circularly left-shifted by 1 bit in accordance with a rule of the following Equation 5. Hereinafter, a new bit grouping method suggested as above will be referred to as the fourth embodiment.

$$B_{shift}(i)=B((i+1) \bmod N),$$

$$Y2_{shift}(i)=Y2((i+1) \bmod N),$$

$$W1_{shift}(i)=W1((i+1) \bmod N), \quad \text{[Equation 5]}$$

wherein, i=0, 1, . . . , N−1.

Referring to FIG. 13, the output sequences of new bit grouping according to the fourth embodiment include interleaved A subblock sequences and circularly-shifted $B_{shift}$ subblock sequences, bit-by-bit multiplexed (or interlaced) sequences of interleaved Y1 subblock sequences and circularly-shifted $Y2_{shift}$ subblock sequences, and bit-by-bit multiplexed sequences of circularly-shifted $W1_{shift}$ subblock sequences and W2 subblock sequences. In this case, in the same manner as the third embodiment, it may be considered that the sequences are multiplexed bit-by-bit, wherein 2 bits are set to one unit. In this case, the fourth embodiment is different from the third embodiment illustrated in FIG. 11 and FIG. 12 in that the subblock Y2 not the subblock Y1 is circularly-shifted and the subblock W1 not the subblock W2 is circularly-shifted. The result of simulation performed for the bit grouping method according to the fourth embodiment is substantially similar to that of the third embodiment illustrated in FIG. 11 and FIG. 12.

Figure 14:
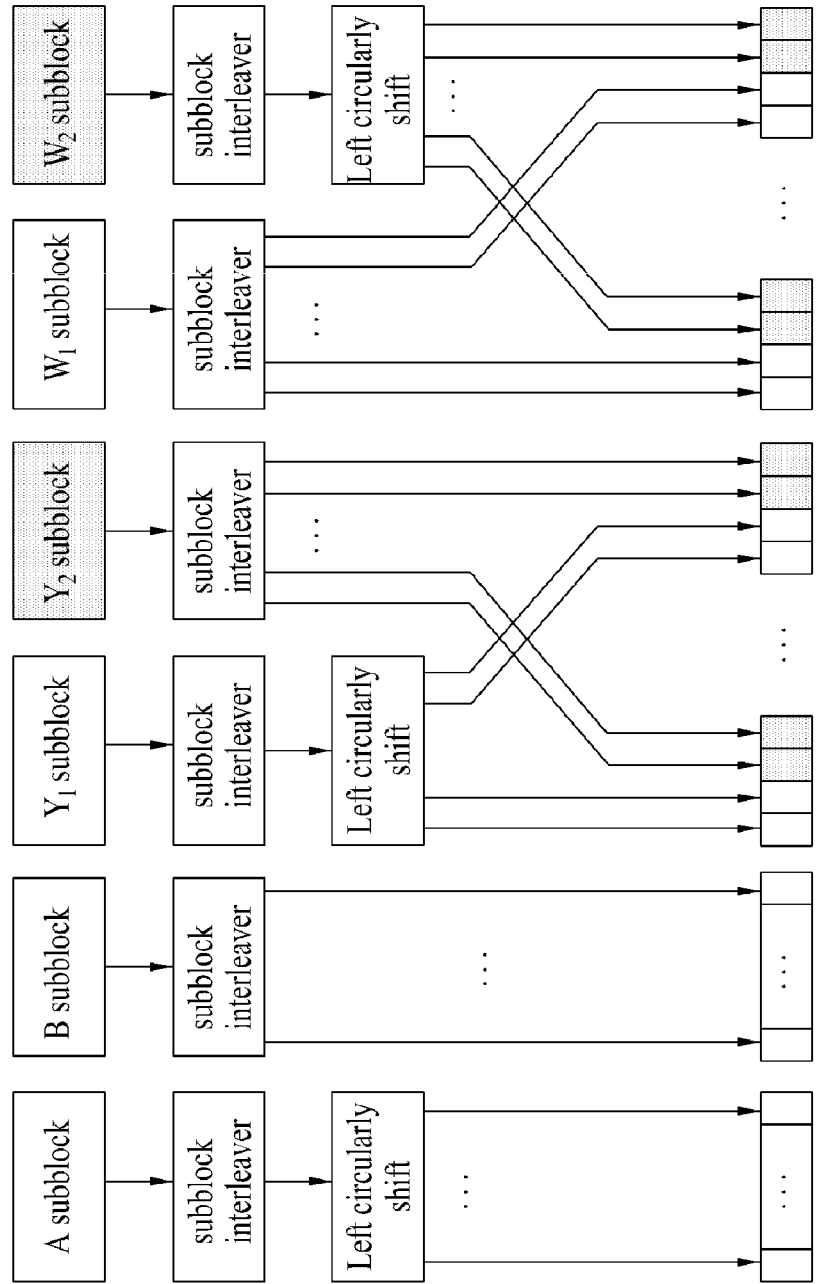
FIG. 14 is a block diagram illustrating another example of a new bit grouping method in an IEE 802.16m system.

FIG. 14 is a block diagram illustrating another example of a new bit grouping method in an IEE 802.16m system.

According to another embodiment of the present invention, interleaved sequences of the subblock A, the subblock Y1, and the subblock W2 are circularly left-shifted by 1 bit, respectively in accordance with a rule of the following Equation 6. Hereinafter, a new bit grouping method suggested as above will be referred to as the fifth embodiment.

$$A_{shift}(i)=A((i+1) \bmod N),$$

$$Y1_{shift}(i)=Y1((i+1) \bmod N),$$

$$W2_{shift}(i)=W2((i+1) \bmod N), \quad \text{[Equation 6]}$$

wherein, i=0, 1, . . . , N−1.

Referring to FIG. 14, the output sequences of new bit grouping according to the fifth embodiment include circularly-shifted $A_{shift}$ subblock sequences and interleaved B subblock sequences, bit-by-bit multiplexed (or interlaced) sequences of circularly-shifted $Y1_{shift}$ subblock sequences and interleaved Y2 subblock sequences, and bit-by-bit multiplexed sequences of interleaved W1 subblock sequences and circularly-shifted $W2_{shift}$ subblock sequences. In this case, in the same manner as the third embodiment and the fourth embodiment, it may be considered that the sequences are bit-by-bit multiplexed, wherein 2 bits are set to one unit. In this case, the fifth embodiment is different from the third embodiment illustrated in FIG. 11 and FIG. 12 in that the subblock A not the subblock B is circularly shifted. The result of simulation performed for the bit grouping method according to the fifth embodiment is substantially similar to that of the third embodiment illustrated in FIG. 11 and FIG. 12.

Figure 15:
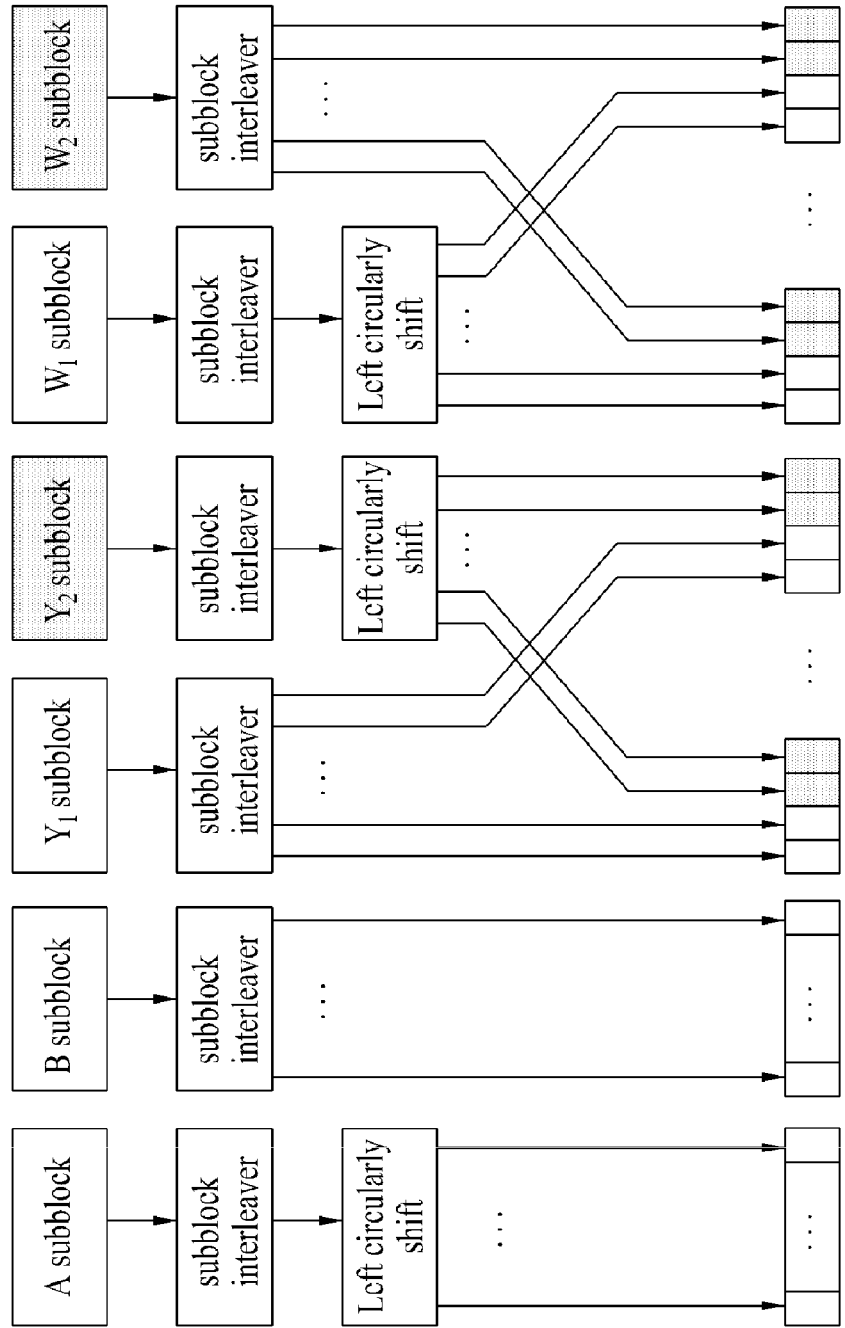
FIG. 15 is a block diagram illustrating another example of a new bit grouping method in an IEE 802.16m system.

FIG. 15 is a block diagram illustrating another example of a new bit grouping method in an IEE 802.16m system.

According to another embodiment of the present invention, interleaved sequences of the subblock A, the subblock Y2, and the subblock W1 are circularly left-shifted by 1 bit, respectively in accordance with a rule of the following Equation 7. Hereinafter, a new bit grouping method suggested as above will be referred to as the sixth embodiment.

$$A_{shift}(i)=A((i+1) \bmod N),$$

$$Y2_{shift}(i)=Y2((i+1) \bmod N),$$

$$W1_{shift}(i)=W1((i+1) \bmod N), \quad \text{[Equation 7]}$$

wherein, i=0, 1, . . . , N−1.

Referring to FIG. 15, the output sequences of new bit grouping according to the sixth embodiment include circularly-shifted $A_{shift}$ subblock sequences and interleaved B subblock sequences, bit-by-bit multiplexed (or interlaced) sequences of interleaved Y1 subblock sequences and circularly-shifted $Y2_{shift}$ subblock sequences, and bit-by-bit multiplexed sequences of circularly-shifted $W1_{shift}$ subblock sequences and W2 subblock sequences. In this case, in the same manner as the third embodiment to the fifth embodiment, it may be considered that the sequences are multiplexed bit-by-bit, wherein 2 bits are set to one unit. In this case, the sixth embodiment is different from the fifth embodiment in that the subblock A not the subblock B is circularly shifted. The result of simulation performed for the bit grouping method according to the sixth embodiment is substantially similar to that of the fifth embodiment.

Hereinafter, an apparatus for transmitting a signal using bit grouping according to the present invention will be described.

The apparatus for transmitting a signal using bit grouping includes a mapper, an subblock interleaver, a circular-shift module, a bit grouping output sequence generation module, and a transmission module.

The mapper may map systematic bits of the output bits from the CTC encoder to the subblock A and the subblock B and also may map parity bits of the output bits to the subblocks Y1, Y2, W1 and W2.

The subblock interleaver performs subblock interleaving for each of the subblocks A, B, Y1, Y2, W1 and W2. The circular shift module performs circularly-shifting one of the interleaved subblocks A and B by a predetermined bit.

At this time, after the subblock interleaving is performed, the output bits of the subblocks Y1 and Y2 and the output bits of the subblocks W1 and W2 can be multiplexed bit-by-bit and then mapped with the output sequences.

The bit grouping output sequence generation module performs bit grouping for the bits of the circularly-shifted subblock B and the bits of the interleaved subblocks A, Y1, Y2, W1 and W2 to generate the output sequences. The transmission module transmits the output sequences.

The bit grouping method according to the embodiments of the present invention has advantages in that it is similar to the bit grouping method of the related art in view of complexity and bit reliability is uniformly distributed. Also, owing to such advantages, it is advantageous in that more exact data or signal transmission can be performed.

The aforementioned embodiments are achieved by combination of structural elements and features of the present invention in a predetermined type. Each of the structural elements or features should be considered selectively unless specified separately. Each of the structural elements or features may be carried out without being combined with other structural elements or features. Also, some structural elements and/or features may be combined with one another to constitute the embodiments of the present invention. The order of operations described in the embodiments of the present invention may be changed. Some structural elements or features of one embodiment may be included in another embodiment, or may be replaced with corresponding structural elements or features of another embodiment. Moreover, it will be apparent that some claims referring to specific claims may be combined with another claims referring to the other claims other than the specific claims to constitute the embodiment or add new claims by means of amendment after the application is filed.

The embodiments according to the present invention can be implemented by various means, for example, hardware, firmware, software, or their combination. If the embodiment according to the present invention is implemented by hardware, the embodiment of the present invention can be implemented by one or more application specific integrated circuits (ASICs), digital signal processors (DSPs), digital signal processing devices (DSPDs), programmable logic devices (PLDs), field programmable gate arrays (FPGAs), processors, controllers, microcontrollers, microprocessors, etc. If the embodiment according to the present invention is implemented by firmware or software, the embodiment of the present invention can be implemented by a type of a module, a procedure, or a function, which performs functions or operations described as above. A software code may be stored in a memory unit and then may be driven by a processor. The memory unit may be located inside or outside the processor to transmit and receive data to and from the processor through various means which are well known.

It will be apparent to those skilled in the art that the present invention can be embodied in other specific forms without departing from the spirit and essential characteristics of the invention. Thus, the above embodiments are to be considered in all respects as illustrative and not restrictive. The scope of the invention should be determined by reasonable interpretation of the appended claims and all change which comes within the equivalent scope of the invention are included in the scope of the invention.

What is claimed is:

1. A method for transmitting a signal using bit grouping in a wireless communication system, the method comprising:
    mapping systematic bits of output bits of a convolutional turbo code (CTC) encoder to first and second subblocks and mapping parity bits of the output bits to third to sixth subblocks;
    performing subblock interleaving for each of the first to sixth subblocks;
    performing circularly shifting the interleaved first subblock by a predetermined bit; and
    generating output sequences using the bits of the circularly-shifted first subblock and the bits of the interleaved second to sixth subblocks;
    transmitting the output sequences.

2. The method of claim 1, wherein the output bits of the interleaved third subblock and the fourth subblock and the output bits of the interleaved fifth subblock and sixth subblock are multiplexed bit-by-bit and mapped to the output sequences.

3. The method of claim 1, wherein the interleaved first subblock is circularly left-shifted by 1 bit.

4. The method of claim 1, wherein the first subblock is a subblock A or a subblock B.

5. The method of claim 1, wherein the third subblock or the fourth subblock is a subblock Y1 or subblock Y2.

6. The method of claim 1, wherein the fifth subblock or the sixth subblock is a subblock W1 or subblock W2.

7. An apparatus for transmitting a signal using bit grouping in a wireless communication system, the apparatus comprising:
    a mapper mapping systematic bits of output bits of a convolutional turbo code (CTC) encoder to first and second subblocks and mapping parity bits of the output bits to third to sixth subblocks;
    an subblock interleaver performing subblock interleaving for each of the first to sixth subblocks;
    a circular-shift module performing circularly shifting the interleaved first subblock by a predetermined bit;
    a bit grouping output sequence generation module generating output sequences using the bits of the circularly-shifted first subblock and the bits of the subblock interleaved second to sixth subblocks; and
    a transmission module transmitting the output sequences.

8. The apparatus of claim 7, wherein, the output bits of the interleaved third subblock and the fourth subblock and the output bits of the interleaved fifth subblock and sixth subblock are multiplexed bit-by-bit and mapped to the output sequences.

9. The apparatus of claim 7, wherein the interleaved first subblock is circularly left-shifted by 1 bit.

10. The apparatus of claim 7, wherein the first subblock is a subblock A or a subblock B.

11. The apparatus of claim 7, wherein the third subblock or the fourth subblock is a subblock Y1 or a subblock Y2.

12. The apparatus of claim 7, wherein the fifth subblock or the sixth subblock is a subblock W1 or a subblock W2.

* * * * *